US010432190B2

(12) United States Patent
Kono

(10) Patent No.: US 10,432,190 B2
(45) Date of Patent: Oct. 1, 2019

(54) SEMICONDUCTOR DEVICE AND METHOD FOR CONTROLLING SEMICONDUCTOR DEVICE

(71) Applicant: KABUSHIKI KAISHA TOSHIBA, Tokyo (JP)

(72) Inventor: Hiroshi Kono, Himeji Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 153 days.

(21) Appl. No.: 15/445,751

(22) Filed: Feb. 28, 2017

(65) Prior Publication Data
US 2018/0083615 A1    Mar. 22, 2018

(30) Foreign Application Priority Data

Sep. 21, 2016    (JP) .................................. 2016-184626

(51) Int. Cl.
*H03K 17/20*    (2006.01)
*H01L 23/528*    (2006.01)
(Continued)

(52) U.S. Cl.
CPC ........... *H03K 17/20* (2013.01); *H01L 23/528* (2013.01); *H01L 27/0727* (2013.01); *H01L 29/1608* (2013.01); *H01L 29/7802* (2013.01); *H01L 29/7804* (2013.01); *H01L 29/7827* (2013.01); *H01L 29/861* (2013.01); *H02M 1/088* (2013.01); *H02M 7/5387* (2013.01);
(Continued)

(58) Field of Classification Search
CPC ........ H03K 17/20; H03K 17/00; H03K 19/00; H03K 5/13; H01L 23/00; H01L 27/00; H02M 1/00; H02M 7/00; H02P 27/06
See application file for complete search history.

(56) References Cited

U.S. PATENT DOCUMENTS

| 6,979,863 | B2 | 12/2005 | Ryu |
| 8,698,229 | B2 * | 4/2014 | Willmeroth ......... H01L 29/0634 |
| | | | 257/329 |

(Continued)

FOREIGN PATENT DOCUMENTS

| JP | 5210518 B2 | 6/2013 |
| JP | 5277579 B2 | 8/2013 |

(Continued)

*Primary Examiner* — Bickey Dhakal
*Assistant Examiner* — Said Bouziane
(74) *Attorney, Agent, or Firm* — Kim & Stewart LLP

(57) ABSTRACT

A semiconductor device comprises a first transistor with a silicon carbide layer between the source and the drain electrodes and between the gate and drain electrodes. A diode is formed in the silicon carbide layer. A forward voltage of the diode varies with the voltage applied to the gate electrode of the first transistor. A second transistor is connected to the first transistor. A gate controller applies voltages to gates of the first and second transistor such that the first and second transistors are set to an off-state a first time. The first gate voltage is then increased to an intermediate voltage that is less than a threshold voltage of the first transistor. The intermediate voltage is sufficient to alter the forward voltage of the diode and permit a forward current to flow in the diode. The first gate voltage is then increased to an on-state voltage.

20 Claims, 12 Drawing Sheets

(51) Int. Cl.
  *H01L 27/07* (2006.01)
  *H01L 29/16* (2006.01)
  *H01L 29/78* (2006.01)
  *H01L 29/861* (2006.01)
  *H02M 1/088* (2006.01)
  *H02M 7/5387* (2007.01)
  *H02P 27/06* (2006.01)
  *H03K 17/687* (2006.01)
  *H03K 17/74* (2006.01)
  *H02P 7/03* (2016.01)

(52) U.S. Cl.
  CPC ........... *H02P 27/06* (2013.01); *H03K 17/687* (2013.01); *H03K 17/74* (2013.01); *H02P 7/04* (2016.02); *H03K 2217/0045* (2013.01); *Y02B 70/1483* (2013.01)

(56) References Cited

U.S. PATENT DOCUMENTS

| | | | |
|---|---|---|---|
| 9,349,853 B2 | 5/2016 | Morizuka | |
| 2010/0224885 A1* | 9/2010 | Onose | H01L 24/49 257/77 |
| 2012/0057386 A1* | 3/2012 | Adachi | H01L 29/1608 363/131 |
| 2014/0084993 A1* | 3/2014 | Takao | G05F 3/20 327/534 |
| 2015/0263000 A1 | 9/2015 | Kono et al. | |
| 2015/0340965 A1 | 11/2015 | Hirao et al. | |
| 2016/0225855 A1* | 8/2016 | Hiyoshi | H01L 29/872 |

FOREIGN PATENT DOCUMENTS

| | | |
|---|---|---|
| JP | 2015176889 A | 10/2015 |
| JP | 2015177094 A | 10/2015 |
| JP | 2015222777 A | 12/2015 |

* cited by examiner

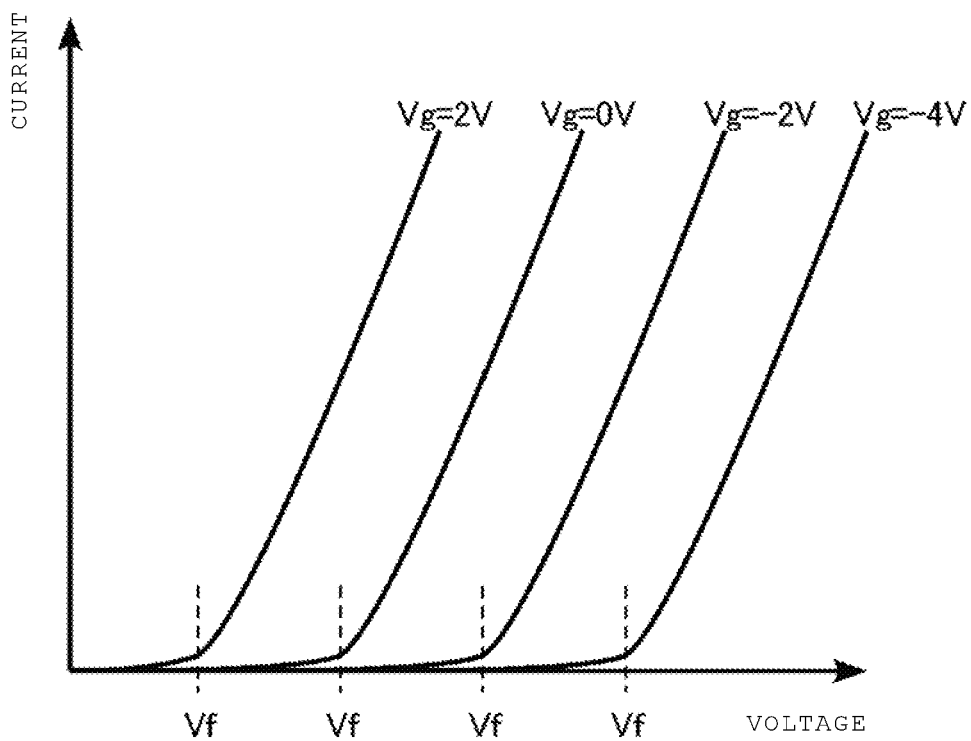

SEMICONDUCTOR DEVICE AND METHOD FOR CONTROLLING SEMICONDUCTOR DEVICE

CROSS-REFERENCE TO RELATED APPLICATION

This application is based upon and claims the benefit of priority from Japanese Patent Application No. 2016-184626, filed Sep. 21, 2016, the entire contents of which are incorporated herein by reference.

FIELD

Embodiments described herein relate generally to a semiconductor device and a method for controlling the semiconductor devices.

BACKGROUND

Silicon carbide is expected to be used as a material for next-generation semiconductor devices. Silicon carbide has better physical properties than silicon in that its band gap is 3 times larger than silicon, breakdown electric field intensity is about 10 times better, and thermal conductivity is about 3 times better. When these characteristics are utilized, for example, metal oxide semiconductor field effect transistors (MOSFETs) capable of operating at higher breakdown voltage, at lower loss, and at higher temperatures can be realized.

Vertical MOSFETs have body diodes. For example, when MOSFETs are used as switching elements connected to inductive loads, even when the MOSFETs are nominally turned off, reflux currents can flow through the body diodes.

However, when reflux currents are flowed through the body diodes, stacking faults can grow in silicon carbide layers used to form these MOSFETS due to recombination energy of carriers, and thus there is a problem that on-state resistance of the MOSFETs will increase. The increase in the on-state resistance of MOSFETs results in a reduction in reliability of MOSFETs.

DESCRIPTION OF THE DRAWINGS

FIG. 3 is a diagram illustrating current-voltage characteristics of a body diode according to the first embodiment.

BRIEF SUMMARY

Figure 1:
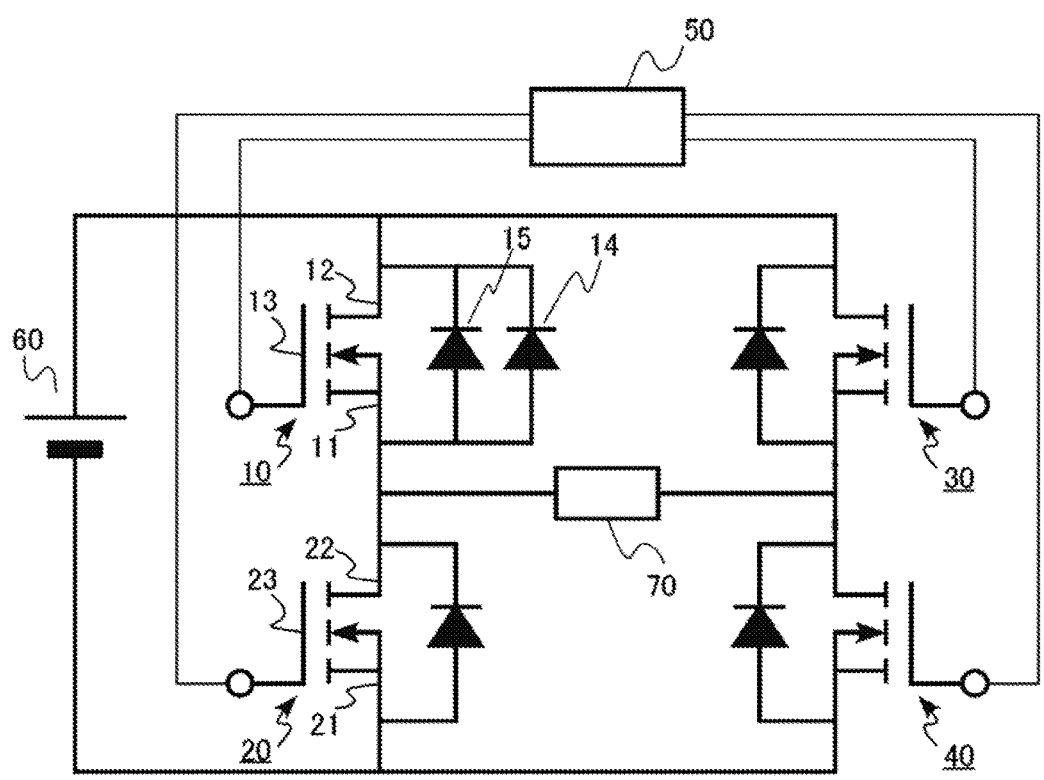
FIG. 1 is a circuit diagram illustrating a semiconductor device according to a first embodiment.

In general, according to one embodiment, a semiconductor device, comprises a first transistor including a first source electrode, a first drain electrode, a first gate electrode, a silicon carbide layer, which is between the first source electrode and the first drain electrode and between the first gate electrode and the first drain electrode, and a diode formed in the silicon carbide layer. The first source electrode is an anode of the diode. The first drain electrode is a cathode of the diode. The diode has a forward voltage that varies in accordance with a voltage applied to the first gate electrode. A second transistor includes a second source electrode, a second drain electrode connected to the first source electrode, and a second gate electrode. A gate controller is configured to apply a first gate voltage to the first gate electrode and a second gate voltage to the second gate electrode such that the first and second gate voltages are set to a predetermined off-state voltage at a first time; the first gate voltage is increased from the predetermined off-state voltage to an intermediate voltage that is less than a first threshold voltage of the first transistor while a difference between a voltage of the first drain electrode and a voltage of the first source electrode is decreasing, the intermediate voltage being applied at a second time after the first time and sufficient to alter the forward voltage of the diode and permit a forward current to flow in the diode; and the first gate voltage is increased from the intermediate voltage to a predetermined on-state voltage at a third time after the second time.

DETAILED DESCRIPTION

Hereinafter, example embodiments will be described with reference to the drawings. In the following description, identical or similar elements are given the same reference symbols, and repeated elements in different embodiments described once may not be described.

In the following description, notation of $n^+$, $n$, $n^-$, and $p^+$, $p$, and $p^-$ indicate relative elevation differences in impurity concentration of conductivity types. That is, $n^+$ indicates that an n-type impurity concentration is relatively higher than n, and $n^-$ indicates that an n-type impurity concentration is relatively lower than n. Further, $p^+$ indicates that a p-type impurity concentration is relatively higher than p, and $p^-$ indicates that a p-type impurity concentration is relatively lower than p. Furthermore, $n^+$ and $n^-$ types may be simply notated as an n-type and $p^+$ and $p^-$ types are simply notated as a p-type in some cases.

An impurity concentration can be measured by, for example, a secondary ion mass spectrometry (SIMS). A relative difference of an impurity concentration can also be determined from a carrier concentration difference obtained by, for example, a scanning capacitance microscopy (SCM).

First Embodiment

According to the embodiment, a semiconductor device includes a first transistor, a second transistor, and a gate control device. The first transistor has a predetermined threshold voltage. The first transistor includes a first source electrode, a first drain electrode, a first gate electrode, a silicon carbide layer which is at least partially provided between the first source electrode and the first drain electrode and is at least partially provided between the first gate electrode and the first drain electrode, and a diode provided in the silicon carbide layer. The first source electrode serves as an anode of the diode. The first drain electrode serves as a cathode of the diode. The forward voltage is modulated in accordance with a voltage applied to the first gate electrode. The second transistor includes a second source electrode, a second drain electrode connected to the first source electrode, and a second gate electrode. The gate control device controls voltages applied to the first and second gate electrodes. The gate control device performs control to apply a predetermined off-state voltage to the first and second gate electrodes, to increase the voltage applied to the first gate electrode in a state in which a difference between a voltage of the first drain electrode and a voltage of the first source electrode continuously decreases, to change the voltage applied to the first gate electrode so that a time rate of change of the voltage less than the threshold voltage is reversed to decrease, to change the voltage applied to the first gate electrode so that the time rate of change of the voltage is reversed to increase in a state in which the forward current flows in the diode, and then, to apply a predetermined on-state voltage to the first gate electrode.

FIG. 1 is a circuit diagram illustrating a semiconductor device according to the first embodiment. The semiconductor device according to the first embodiment is a single-phase inverter circuit.

The single-phase inverter circuit according to the first embodiment includes a first transistor 10, a second transistor 20, a third transistor 30, a fourth transistor 40, and a gate control device 50. Here, the inverter circuit is connected to a power supply 60 and an inductive load 70. The inverter circuit controls a voltage applied to the inductive load 70 using the first transistor 10, the second transistor 20, the third transistor 30, and the fourth transistor 40 as switching elements.

Figure 2:
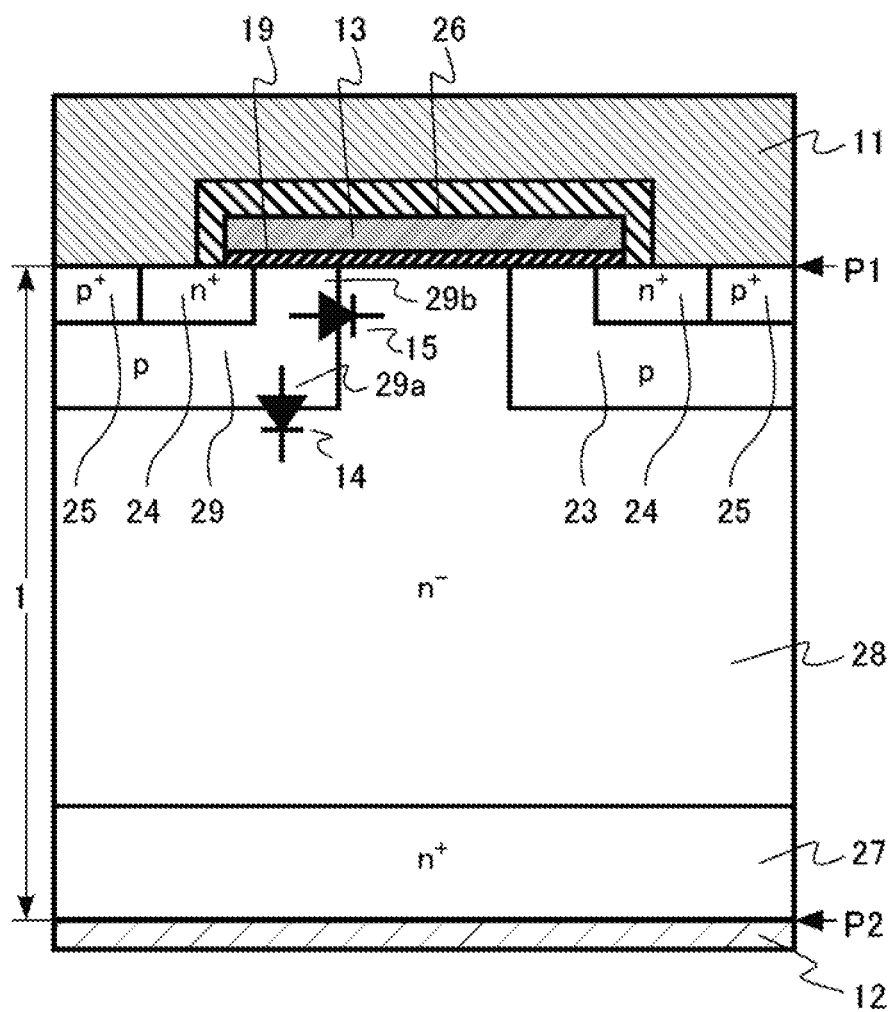
FIG. 2 is a schematic sectional view illustrating a first transistor according to the first embodiment.

FIG. 2 is a schematic sectional view illustrating the first transistor 10 according to the first embodiment. Here, the first transistor 10 is a planar gate vertical MOSFET formed using silicon carbide. The first transistor 10 is, for example, a double implantation MOSFET (DIMOSFET) in which a body region and a source region are formed by ion implantation.

The first transistor 10 is a vertical n-channel type MOSFET in which electrons are used as carriers. The first transistor 10 has a predetermined threshold voltage (Vth1).

The first transistor 10 includes a silicon carbide layer 1, a first source electrode 11, a first drain electrode 12, a first gate electrode 13, a gate insulation layer 19, and an interlayer insulating layer 26.

The silicon carbide layer 1 includes an $n^+$ type drain region 27, an $n^-$ type drift region 28, a p-type body region 29, an $n^+$ type source region 24, and a $p^+$ type body contact region 25.

At least a part of the silicon carbide layer 1 is between the first source electrode 11 and the first drain electrode 12. At least a part of the silicon carbide layer 1 is between the first gate electrode 13 and the first drain electrode 12. The silicon carbide layer 1 has a monocrystalline structure. More specifically, the silicon carbide layer 1 has a structure of, for example, 4H—SiC.

The silicon carbide layer 1 has a first surface ("P1" in FIG. 2) and a second surface ("P2" in FIG. 2). The first surface may be referred to as a front surface and the second surface may be referred to as a rear surface.

The first surface has an inclined angle of not less than 0° and not more than 8° relative to a (0001) plane. In addition, the second surface has an inclined angle of not less than 0° and not more than 8° relative to a (000-1) plane. The (0001) plane may be referred to as a silicon plane. The (000-1) plane may be referred to as a carbon plane.

The $n^+$ type drain region 27 is formed on the rear surface of the silicon carbide layer 1. The $n^-$ type drift region 28 is formed on the drain region 27. The impurity concentration of n-type impurities in the drift region 28 is lower than the impurity concentration of n-type impurities in the drain region 27.

The body region 29 is formed between the source electrode 11 and the drift region 28. An interface region of the body region 29 and the gate insulation layer 19 functions as a channel region of the first transistor 10.

The source region 24 is formed between the source electrode 11 and the body region 29. The source region 24 is separated from the drift region 28. The impurity concentration of n-type impurities in the source region 24 is higher than the impurity concentration of n-type impurities in the drift region 28.

The $p^+$ type body contact region 25 is formed between the source electrode 11 and the body region 29. The impurity concentration of p-type impurities in the body contact region is higher than the impurity concentration of p-type impurities in the body region 29.

The gate electrode 13 is a conductive material. The gate electrode 13 is formed of, for example, polycrystalline silicon containing p-type impurities or n-type impurities.

The gate insulation layer 19 is formed between the gate electrode 13 and the body region 29. The gate insulation layer 19 is formed of, for example, silicon oxide.

The interlayer insulating layer 26 is formed on the gate electrode 13. The interlayer insulating layer 26 is formed of, for example, silicon oxide.

The source electrode 11 contacts the source region 24 and the body contact region 25. The source electrode 11 is a metal. The source electrode 11 can comprise, for example, a stacked structure of titanium (Ti) and aluminum (Al).

The drain electrode 12 is formed on the rear surface of the silicon carbide layer 1. The drain electrode 12 contacts the drain region 27. The drain electrode 12 is made of, for example, a metal or metal-semiconductor compound, such as a metal silicide. For example, the drain electrode 12 can contain a material selected from the group consisting of nickel silicide, titanium (Ti), nickel (Ni), silver (Ag), and gold (Au).

The first transistor 10 includes a first body diode 14 and a second body diode 15 formed in the silicon carbide layer 1.

In the first body diode 14, the source electrode 11 serves as an anode and the drain electrode 12 serves as a cathode. The first body diode 14 is the pn junction between body region 29a and drift region 28. A forward voltage of the first body diode 14 is assumed to be Vf1. Here, "a forward voltage" of a diode refers to a forward biasing threshold voltage at which and above the diode substantially conducts electricity in the forward direction. In some contexts, the "forward voltage" of a diode as used herein may be referred to as a "cut-in voltage." A diode that is forward biased at or above its forward voltage may be said to be "turned on" or in an "on-state." As discussed further below, FIG. 3 depicts I-V characteristics of a body diode including its forward voltage "Vf."

In the second body diode 15, the source electrode 11 serves as an anode and the drain electrode 12 serves as a cathode. The second body diode 15 is the pn junction between body region 29b (portion coming contacting the gate insulation layer 19) and drift region 28. A forward voltage of the second body diode 15 is assumed to be Vf2.

FIG. 3 is a diagram illustrating current-voltage (I-V) characteristics of a body diode according to the first embodiment. Forward characteristics are illustrated for different gate voltages (Vg) being applied to the first gate electrode 13 of the first transistor 10.

As apparent from FIG. 3, the forward voltage Vf of the body diode can be altered by changing the gate voltage (Vg). The forward voltage Vf is lowered by increasing the gate voltage (Vg). These current-voltage characteristics can be described by assuming that the body diode of the first transistor 10 includes a second body diode 15 for which the forward voltage (Vf2) changes with the gate voltage (Vg).

Altering the forward voltage (Vf2) depends on the fact that an electrostatic potential of the body region 29b changes in accordance with the gate voltage (Vg) and a built-in potential of the pn junction is thus changed. On the other hand, the electrostatic potential of the body region 29a is less affected by the gate voltage. Accordingly, the forward voltage (Vf1) of the first body diode 14 is not substantially changed when the gate voltage changes.

Accordingly, for example, by applying a positive gate voltage to the first gate electrode 13, it is possible to lower the forward voltage (Vf2) of the second body diode 15 more than the forward voltage (Vf1) of the first body diode 14. For example, when the forward voltage (Vf1) of the first body diode 14 is in the range of 3 V to 4 V, the forward voltage (Vf2) of the second body diode 15 can be set to be in the range of about 1.5 V to about 2 V by applying an appropriate gate voltage.

The second body diode 15 having the lowered forward voltage (Vf2) performs a unipolar operation of permitting an electron current to flow.

The second transistor 20 includes a second source electrode 21, a second drain electrode 22, and a second gate electrode 23. The second drain electrode 22 is connected to the first source electrode 11 of the first transistor 10.

For example, the second transistor 20, the third transistor 30, and the fourth transistor 40 have the same structure as the first transistor 10.

The gate control device 50 controls timing of the application gate voltages to the gate electrodes of the first transistor 10, the second transistor 20, the third transistor 30, and the fourth transistor 40. The gate control device 50 includes, for example, a gate driving circuit and a gate control signal generation circuit.

The gate control device 50 can be, for example, hardware or a combination of hardware and software. The gate control device 50 can be, for example, an integrated circuit (IC) or a printed circuit substrate or board. The gate control device 50 may be a plurality of ICs or a combination of a plurality of ICs and printed circuit boards.

The gate control device 50 applies a predetermined off-state voltage to the first gate electrode 13 and the second gate electrode 23. Subsequently, while the difference between the voltage of the first drain electrode 12 and the voltage of the first source electrode 11 continuously decreases, the voltage applied to the first gate electrode 13 is increased by some intermediate amount to remain below the threshold voltage (Vth1) of the first transistor to permit forward current to flow through the second body diode 15. Then, the voltage applied to the first gate electrode 13 is increased to at least the threshold voltage (Vth1) of the first transistor. An on-state voltage greater than the threshold voltage Vth1 may be applied to the first gate electrode 13. The gate control device 50 has a function of controlling voltages applied to the first gate electrode 13 and the second gate electrode 23.

The inductive load 70 is, for example, a motor.

Next, operational effects and advantages of the inverter circuit according to the first embodiment will be described. An inverter circuit according to a comparison example will also be described to so that aspects of the first embodiment may be explained by comparison to the comparison example.

In the inverter circuit according to the comparison example, the gate control device 50 does not have a function of performing control such that, while the difference between the voltage of the first drain electrode 12 and the voltage of the first source electrode 11 continuously decreases, the voltage applied to the first gate electrode 13 is increased by some intermediate amount to remain below the threshold voltage (Vtht1) of the first transistor so as to permit forward current to flow through the second body diode 15. From this viewpoint, the inverter circuit is different from the inverter circuit according to the first embodiment.

The configuration of the inverter circuit according to the comparison example is substantially the same as that of the circuit diagram of FIG. 1 excepting for the configuration of the gate control device 50 necessary for controlling gate voltages to be supplied to the first through fourth transistors according to the first embodiment. Accordingly, a method for controlling the inverter circuit according to the comparison example may be described by reference to FIG. 1.

Figure 4A:
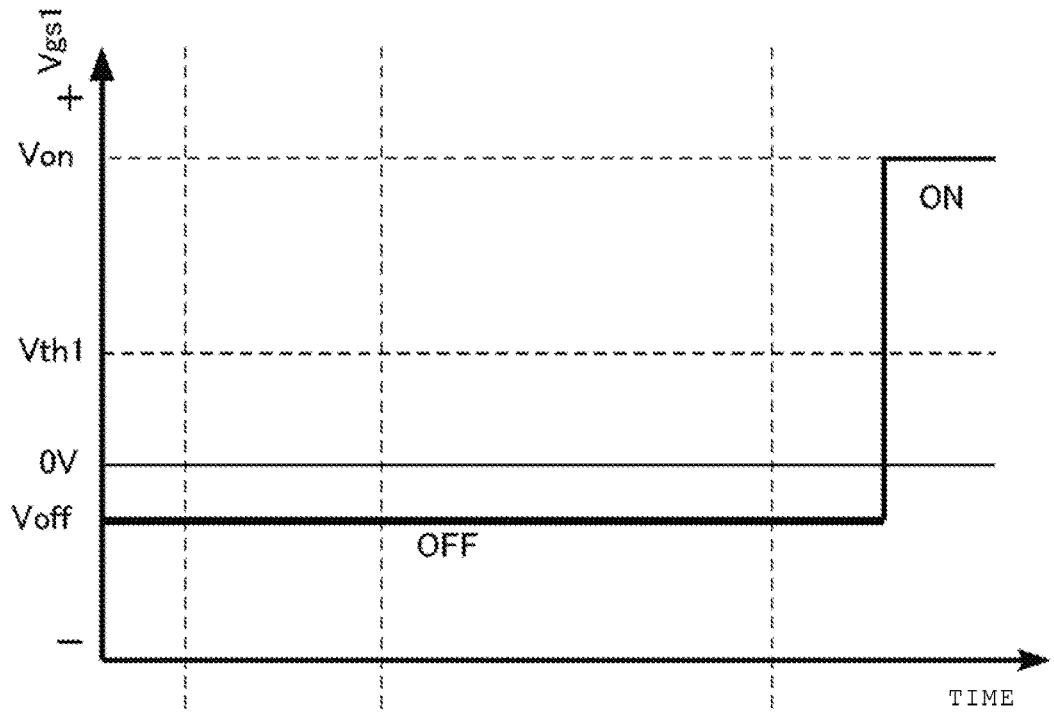
FIGS. 4A and 4B are timing charts illustrating gate voltages of a semiconductor device according to a comparative example.
Figure 4B:
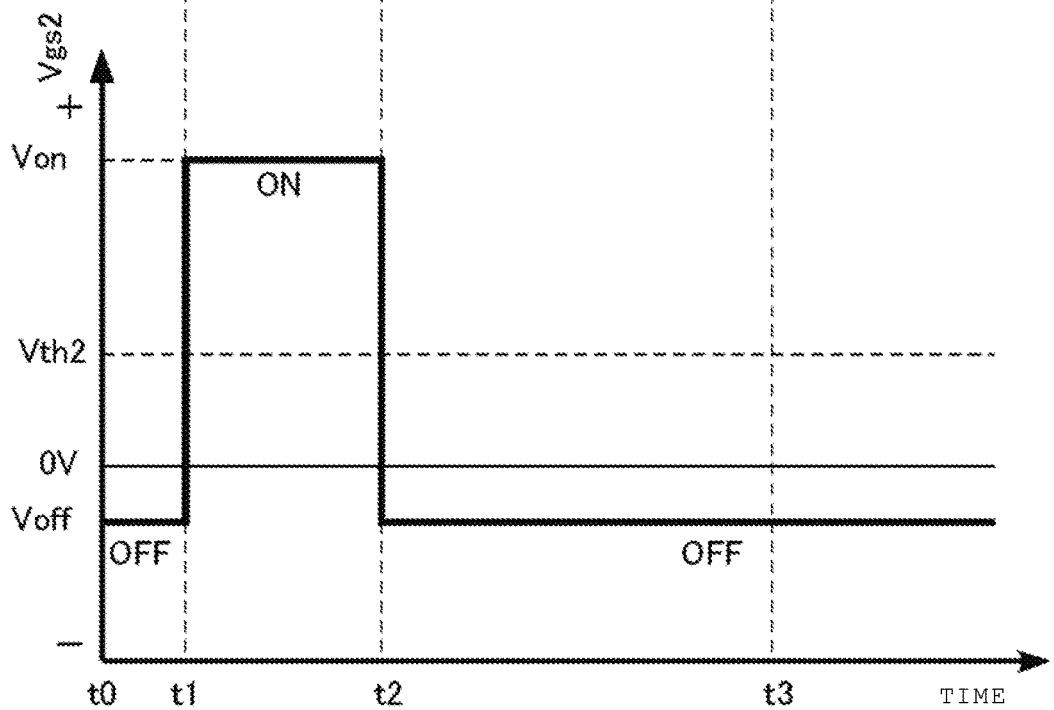

FIGS. 4A and 4B are timing charts illustrating gate voltages to be applied according to the comparative example. FIG. 4A illustrates a relation between a time and a gate voltage (Vgs1) applied between the gate electrode 13 and the source electrode 11 of the first transistor 10 in the comparative example. FIG. 4B illustrates a relation between a time and a gate voltage (Vgs2) applied between the gate electrode 23 and the source electrode 21 of the second transistor 20 in the comparative example.

Figure 5:
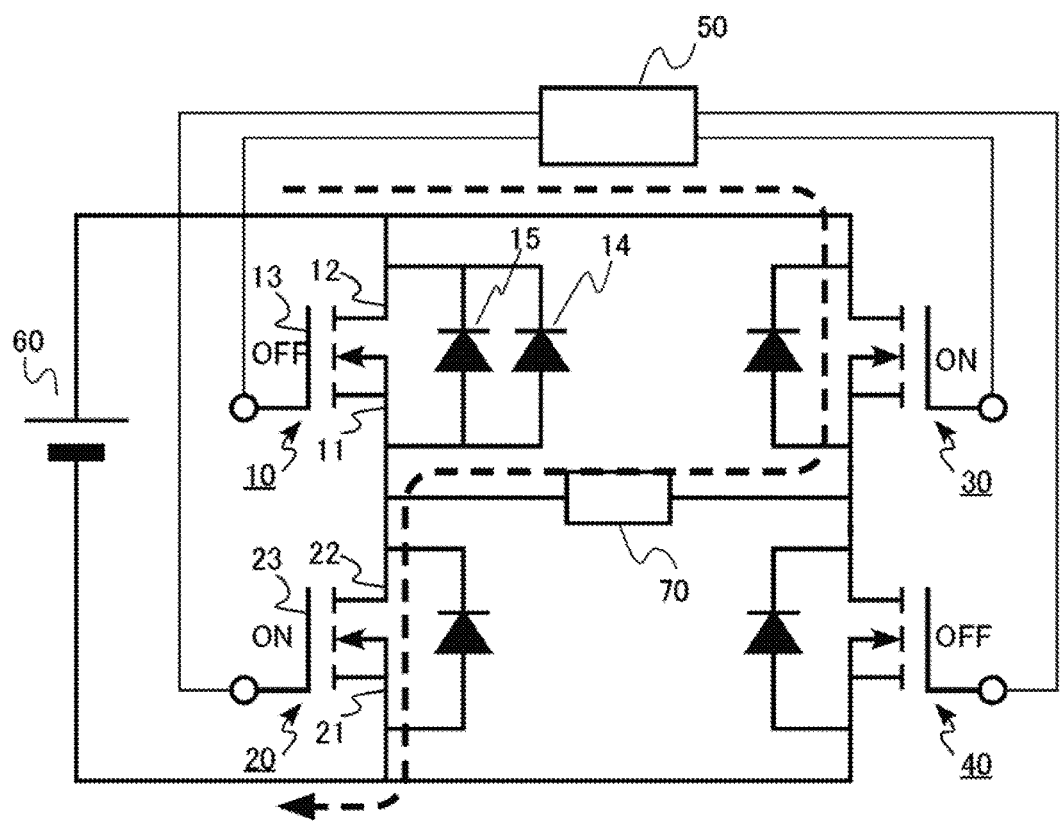
FIG. 5 is a diagram illustrating a current path of an inverter circuit according to the comparative example.
Figure 6:
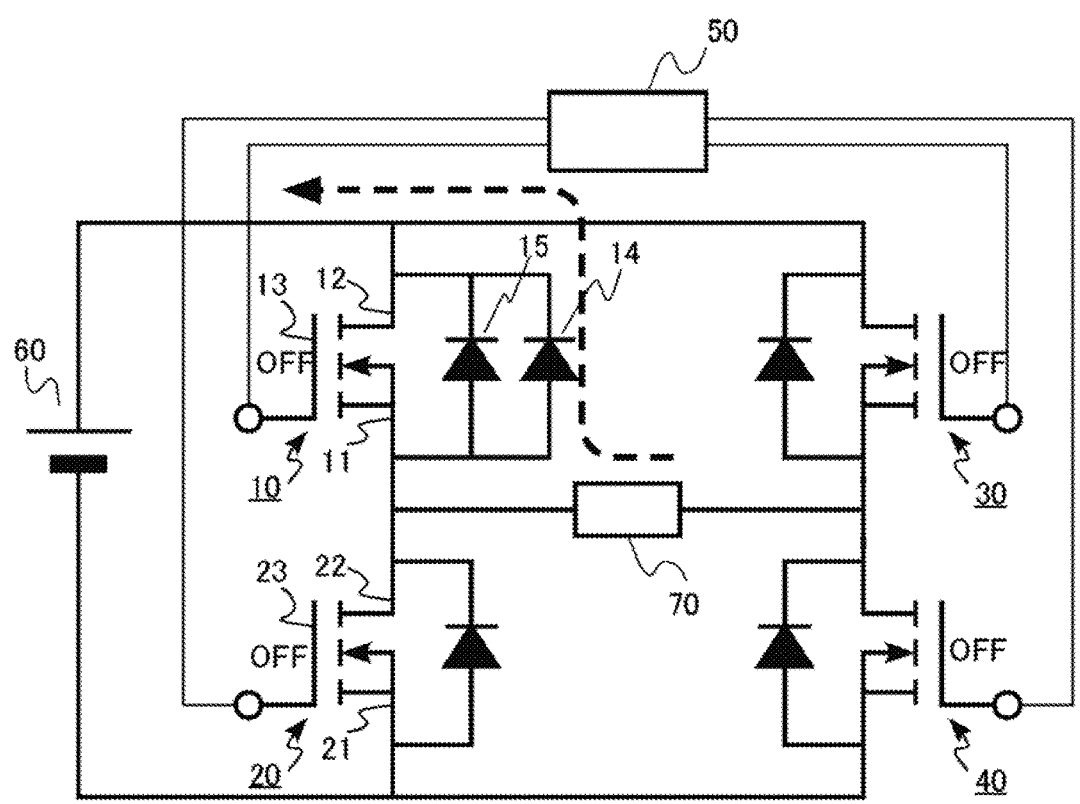
FIG. 6 is a diagram illustrating a current path of an inverter circuit according to the comparative example.

FIGS. 5 and 6 are diagrams illustrating current paths during operation of the inverter circuit according to the comparative example. Currents flowing in the inverter circuit are indicated by dotted lines in FIGS. 5 and 6.

In the inverter circuit according to the comparative example, an off-state voltage (Voff) is applied to the gate electrode 13 of the first transistor 10 and the gate electrode 23 of the second transistor 20 from time t0 to time t1 (see FIGS. 4A and 4B). Accordingly, the first transistor 10 and the second transistor 20 are in an off-state from time t0 to time t1. The off-state voltage (Voff) is, for example, between about 0 V and about −5 V.

From time t1 to time t2, an on-state voltage (Von) is applied to the gate electrode 23 of the second transistor 20 (see FIG. 4B). The on-state voltage (Von) is higher than a threshold voltage (Vth2) of the second transistor 20. The second transistor 20 is thusly in an on-state. The on-state voltage (Von) is, for example, between about 15 V to about 20 V. From time t1 to time t2, the first transistor 10 remains in the off-state.

FIG. 5 illustrates a current path of the current flowing in the inverter circuit of the comparative example during the time period from time t1 to time t2. As depicted in FIG. 5, current flows in the third transistor 30, the inductive load 70, and the second transistor 20.

At time t2, the off-state voltage (Voff) is again applied to the gate electrode 23 of the second transistor 20. Accordingly, both of the first transistor 10 and the second transistor 20 enter the off-state at this time (time t2). At time t2, the third transistor 30 also enters the off-state.

After time t2, the off-state voltage (Voff) is applied to the gate electrode 13 of the first transistor 10 and the gate electrode 23 of the second transistor 20. Accordingly, in the comparative example, the first transistor 10 and the second transistor 20 are in the off-state.

By turning off both the first transistor 10 and the second transistor 20, there is a dead time until the direction of the voltage applied to the inductive load 70 is inverted. This dead time prevents a through-current from flowing through the first transistor 10 and the second transistor 20. When a through-current flows, a large power loss occurs. In addition, there is a concern about the inverter circuit being broken down.

After time t2, after the potential of the drain electrode 22 increases according to an operation of turning the second transistor 20 off, a load current generated by the inductive load may flow, and thus the potential of the source electrode 11 of the first transistor 10 increases. Then, at time t3, a voltage between the source electrode 11 and the drain electrode 12 of the first transistor 10 reaches a forward voltage (Vf1) of the first body diode 14.

FIG. 6 illustrates a current path of a current flowing in the inverter circuit at time t3 according to the comparative example. The load current flows through the first body diode 14 and is returned to the power supply 60. This current flowing in the first body diode 14 can be referred to as a free-wheeling current.

In the case of the inverter circuit according to the comparative example, the load current flows in the first body diode 14 according to a bipolar operation (both holes and electrons as charge carriers). Accordingly, a stacking fault grows in the silicon carbide layer 1 of the first transistor 10 due to recombination charge of carriers. Thus, a problem occurs in that on-state resistance of the first transistor 10 subsequently increases due to growth in stacking faults.

In the inverter circuit according to the comparative example, for example, after the load current has flowed through the first body diode 14, the on-state voltage (Von) is applied to the gate electrode 13 of the first transistor 10 at time t5. Simultaneously, when the fourth transistor 40 is also turned on, a reverse current flows to the inductive load 70 via the first transistor 10 and the fourth transistor 40.

Next, a method for controlling the inverter circuit according to the first embodiment will be described with reference to FIG. 1. According to the first embodiment, a first transistor has a predetermined threshold voltage. The first transistor includes a first source electrode, a first drain electrode, a first gate electrode, a silicon carbide layer which is at least partially provided between the first source electrode and the first drain electrode and is at least partially provided between the first gate electrode and the first drain electrode, and a diode provided in the silicon carbide layer. The first source electrode serves as an anode of the diode. The first drain electrode serves as a cathode of the diode. A forward voltage is changed in accordance with a voltage applied to the first gate electrode. A second transistor includes a second source electrode, a second drain electrode connected to the first source electrode, and a second gate electrode. A method for controlling the first transistor and the second transistor includes applying a predetermined off-state voltage to the first and second gate electrodes, then, while the difference between the voltage of the first drain electrode 12 and the voltage of the first source electrode 11 continuously decreases, increasing the voltage applied to the first gate electrode 13 by some intermediate amount to remain below the threshold voltage (Vtht1) of the first transistor 10 to permit forward current to flow through the second body diode 15, and then, applying a predetermined on-state voltage to the first gate electrode.

Figure 7A:
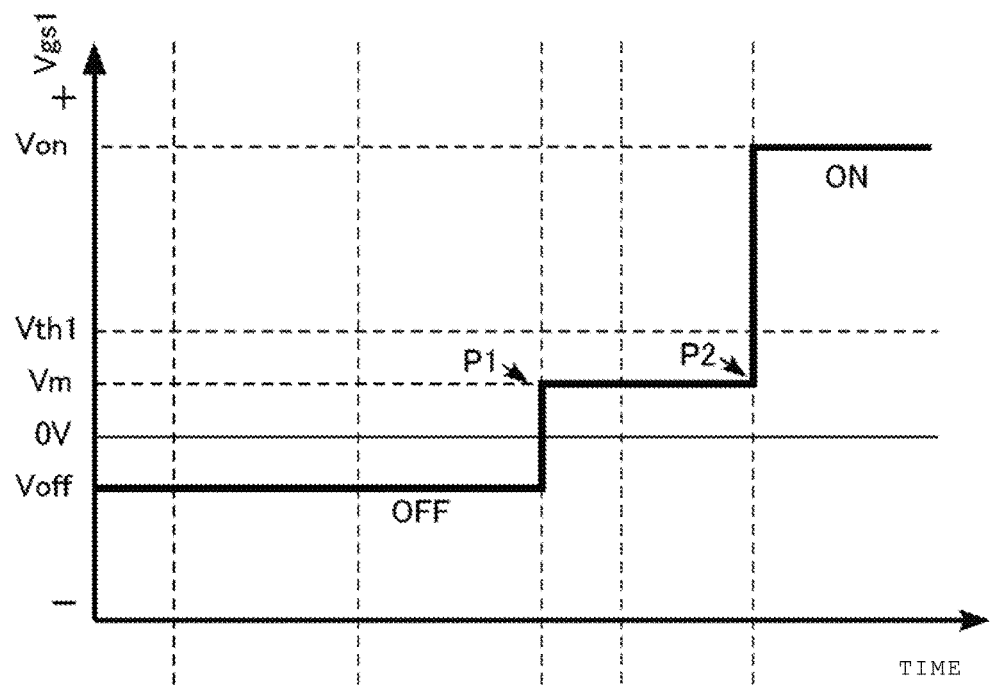
FIGS. 7A and 7B are timing charts illustrating gate voltages of a semiconductor device according to the first embodiment.
Figure 7B:
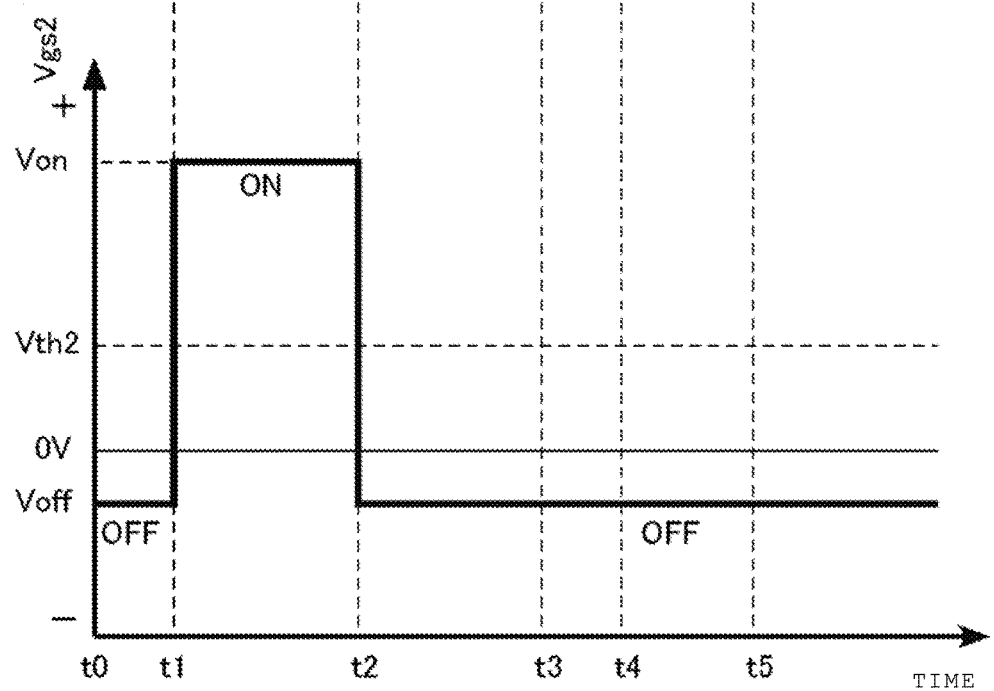

FIGS. 7A and 7B are timing charts illustrating gate voltages of a semiconductor device according to the first embodiment. FIG. 7A illustrates a relation between a time and the gate voltage (Vgs1) applied between the gate electrode 13 and the source electrode 11 of the first transistor 10 according to the first embodiment. FIG. 7B illustrates a relation between a time and the gate voltage (Vgs2) applied between the gate electrode 23 and the source electrode 21 of the second transistor 20 according to the first embodiment.

Figure 8:
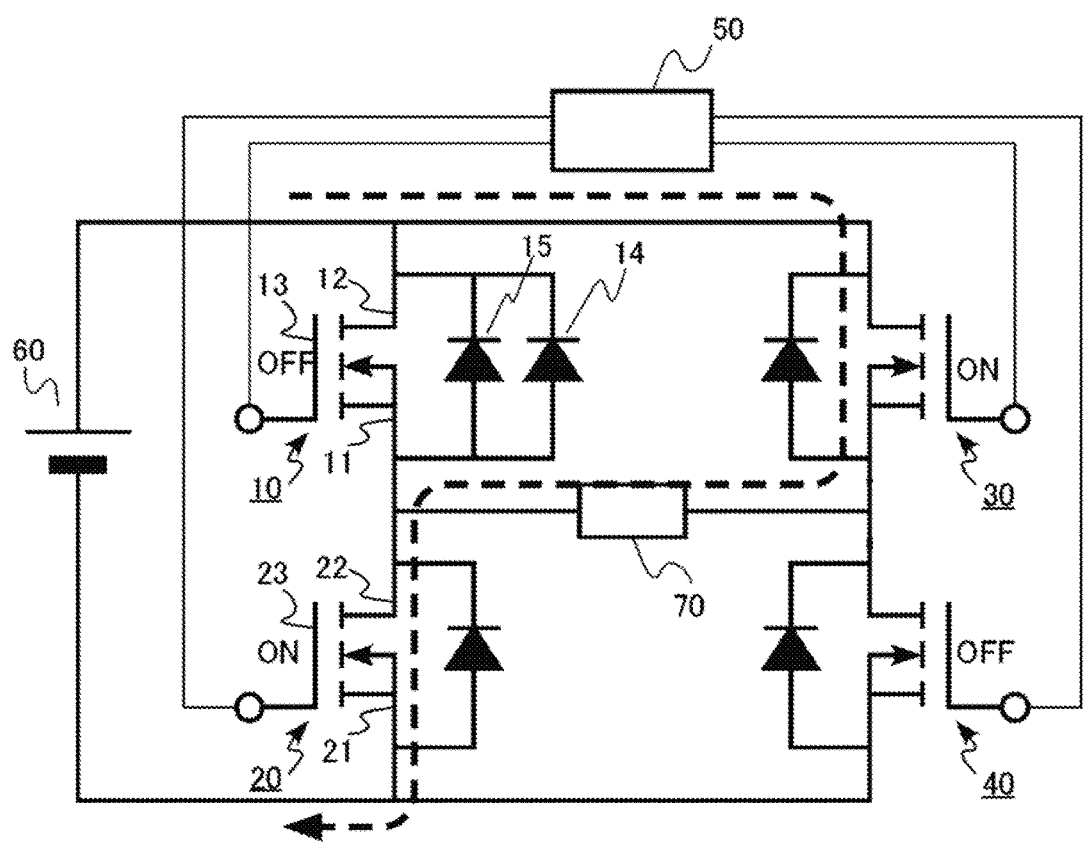
FIG. 8 is a diagram illustrating a current path of an inverter circuit according to the first embodiment.
Figure 9:
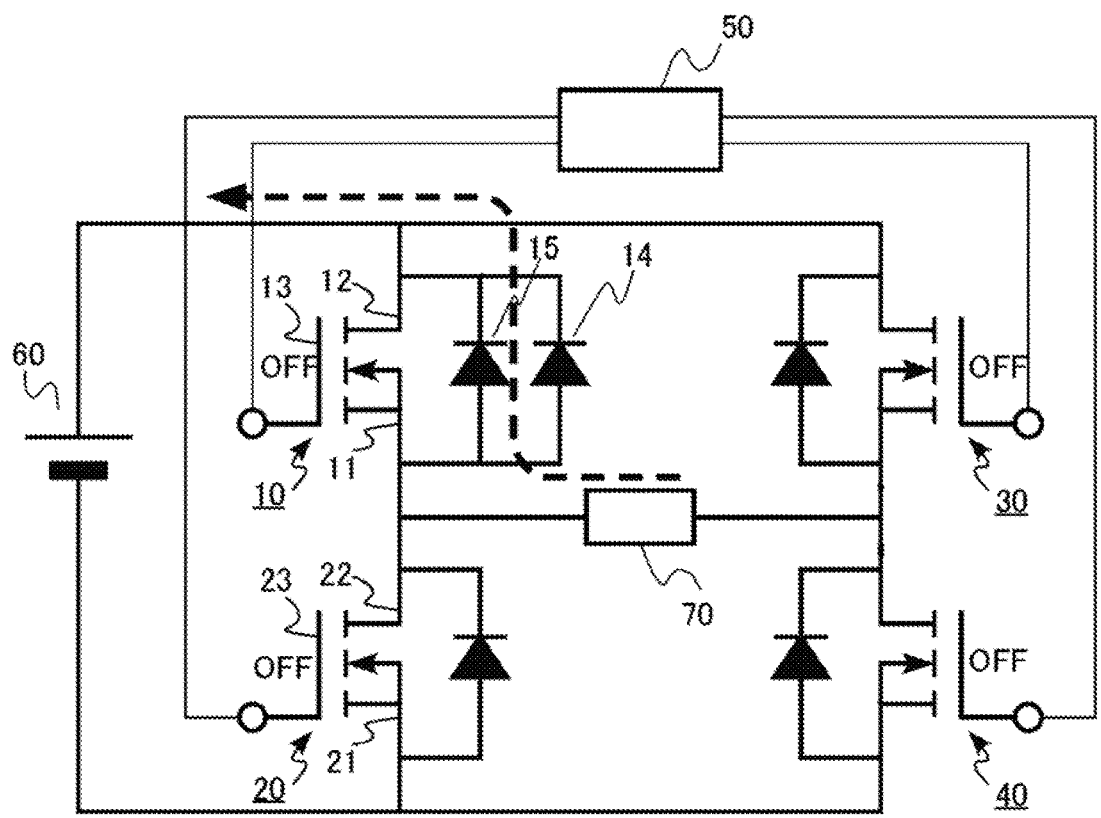
FIG. 9 is a diagram illustrating a current path of an inverter circuit according to the first embodiment.
Figure 10:
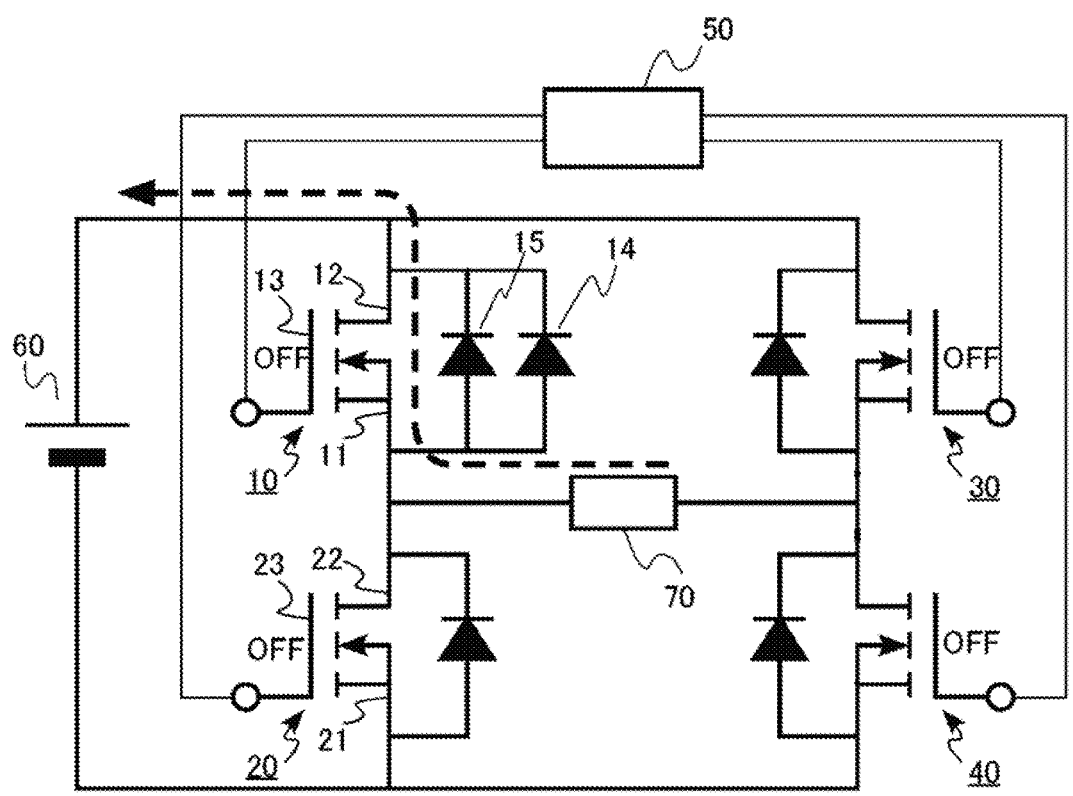
FIG. 10 is a diagram illustrating a current path of an inverter circuit according to the first embodiment.

FIGS. 8, 9, and 10 are diagrams illustrating current paths of an inverter circuit according to the first embodiment. Currents flowing in the inverter circuit are indicated by dotted lines in FIGS. 8, 9, and 10.

In the inverter circuit according to the first embodiment, from time t0 to time t1, the off-state voltage (Voff) is applied to the gate electrode 13 of the first transistor 10 and the gate electrode 23 of the second transistor 20. Accordingly, the first transistor 10 and the second transistor 20 are in an off-state. The off-state voltage (Voff) is, for example, between about −5 V and about 0 V.

From time t1 to time t2, the on-state voltage (Von) is applied to the gate electrode 23 of the second transistor 20. The on-state voltage (Von) is higher than the threshold voltage (Vth2) of the second transistor 20. Thus, the second transistor 20 is in an on-state. The on-state voltage (Von) is, for example, between about 15 V to about 20 V. From time t1 to time t2, the first transistor 10 remains in the off-state.

FIG. 8 illustrates a current path of a current flowing in the inverter circuit according to first embodiment during the period from time t1 to time t2. A current flows in the third transistor 30, the inductive load 70, and the second transistor 20 as depicted in FIG. 8.

At time t2, the off-state voltage (Voff) is again applied to the gate electrode 23 of the second transistor 20. Accordingly, both of the first transistor 10 and the second transistor 20 enter or remain in the off-state. At time t2, the third transistor 30 also enters the off-state.

By turning off both the first transistor 10 and the second transistor 20, a dead time is formed until the direction of a voltage applied to the inductive load 70 is inverted.

After time t2, after the potential of the drain electrode 22 increases according to the operation of turning the second transistor 20 off, a load current generated by the inductive load flows (see FIG. 9), and thus the potential of the source electrode 11 of the first transistor 10 increases. In other words, a difference (Vds) between the voltage of the first drain electrode 12 and the voltage of the first source electrode 11 decreases.

Here, in the first embodiment, before a voltage between the source electrode 11 and the drain electrode 12 of the first transistor 10 hits the forward voltage Vf1 of the first body diode 14, an intermediate voltage (Vm) is applied to the gate electrode 13 of the first transistor 10 at time t3 (see FIG. 7B).

The intermediate voltage (Vm) is a voltage less than the threshold voltage (Vth1) of the first transistor 10. The intermediate voltage (Vm) is applied to the gate electrode 13 of the first transistor 10 from time t3 to time t5. From time t3 to time t5, the intermediate voltage (Vm) is applied to the gate electrode 13 of the first transistor 10 at a substantially constant level.

The threshold voltage (Vth1) of the first transistor 10 is, for example, between about 2.5 V and about 3 V. The intermediate voltage (Vm) is, for example, between about 0

V and about 2 V. By applying the intermediate voltage (Vm) to the gate electrode 13 of the first transistor 10, the forward voltage (Vf2) of the second body diode 15 is lowered. The forward voltage (Vf2) of the second body diode 15 can thus be less than the forward voltage (Vf1) of the first body diode 14.

After time t2, the load current generated by the inductive load 70 flows and increases the potential of the source electrode 11 of the first transistor 10. Eventually, the voltage between the source electrode 11 and the drain electrode 12 of the first transistor 10 can reach the forward voltage (Vf2) of the second body diode 15, for example, at time t4.

FIG. 9 illustrates a current path of a current flowing in the inverter circuit according to the first embodiment at time t4. Here, the load current flows in the second body diode 15 and is returned to the power supply 60. The load current flows in the second body diode 15 performing a unipolar operation. Accordingly, a stacking fault does not grow in the silicon carbide layer 1 of the first transistor 10. Thus, an increase in the on-state resistance of the first transistor 10 is prevented.

In the first embodiment, an off-state voltage is applied to the gate electrode 13 of the first transistor 10 for a predetermined time period from time t2 to time t3. During predetermined time period, the difference (Vds) between the voltage of the first drain electrode 12 and the voltage of the first source electrode 11 decreases. Therefore, it is easier to prevent a through-current from occurring due to an erroneous operation than if the intermediate voltage (Vm) were to be applied immediately at time t2 rather than at time t3.

At time t5, the on-state voltage (Von) is applied to the gate electrode 13 of the first transistor 10. The on-state voltage (Von) is applied to the gate electrode 13 while the load current from the inductive load 70 continues to flow. The on-state voltage (Von) is applied to the gate electrode 13 while a forward current is flowing through the second body diode 15.

The on-state voltage (Von) is higher than the threshold voltage (Vth1) of the first transistor 10. After time t5, the first transistor 10 is in the on-state. The on-state voltage (Von) is, for example, between about 15 V and about 20 V.

A change in the voltage applied to the gate electrode 13 of the first transistor 10 from time t2 to time t5 can be described as follows. The voltage applied to the gate electrode 13 of the first transistor 10 is increased in when the difference (Vds) between the voltage of the first drain electrode 12 and the voltage of the first source electrode 11 decreases. Then, the voltage applied to the first gate electrode 13 is increased at a first point (P1 in FIG. 7A) to an intermediate value less than the threshold voltage (Vth1) yet greater than the off-state voltage of the first transistor 10. The voltage applied to the first gate electrode is then, after some time period, increased to a predetermined on-state voltage level equal to or greater than the threshold voltage (Vth1) (P2 in FIG. 7A). Thereafter, the predetermined on-state voltage (Von) is applied to the first gate electrode 13.

FIG. 10 illustrates a current path of a current flowing in the inverter circuit of the first embodiment after time t5. The load current flows in the channel of the first transistor 10 and is returned to the power supply 60. The load current flows through the first transistor 10 performing a unipolar operation. Accordingly, a stacking fault does not grow in the silicon carbide layer 1 of the first transistor 10. Thus, an increase in the on-state resistance of the first transistor 10 is prevented.

After time t5, the load current primarily flows through the first transistor 10 via the channel having a low on-state resistance instead of through higher resistance current path through the second body diode 15, and thus a power loss can be reduced. A time necessary to regenerate the load current is shortened and a high-speed operation of the inverter circuit according to first embodiment is realized.

For example, at time t5, the fourth transistor 40 enters an on-state. After the load current has flowed through the first transistor 10, a reverse current flows to the inductive load 70 via the first transistor 10 and the fourth transistor 40.

As described above, according to the first embodiment, the growth of the stacking fault in the silicon carbide layer 1 is prevented and the inverter circuit capable of improving reliability is realized. Further, a through-current is still prevented from flowing due to an erroneous operation of the inverter circuit.

Second Embodiment

A semiconductor device according to the second embodiment is different from that of the first embodiment in that the semiconductor device further includes a monitor circuit 80 that monitors a difference between the voltage of the first drain electrode and the voltage of the first source electrode, and the gate control device 50 is configured to increase a voltage applied to the first gate electrode based on of the monitoring of the monitor circuit.

Figure 11:
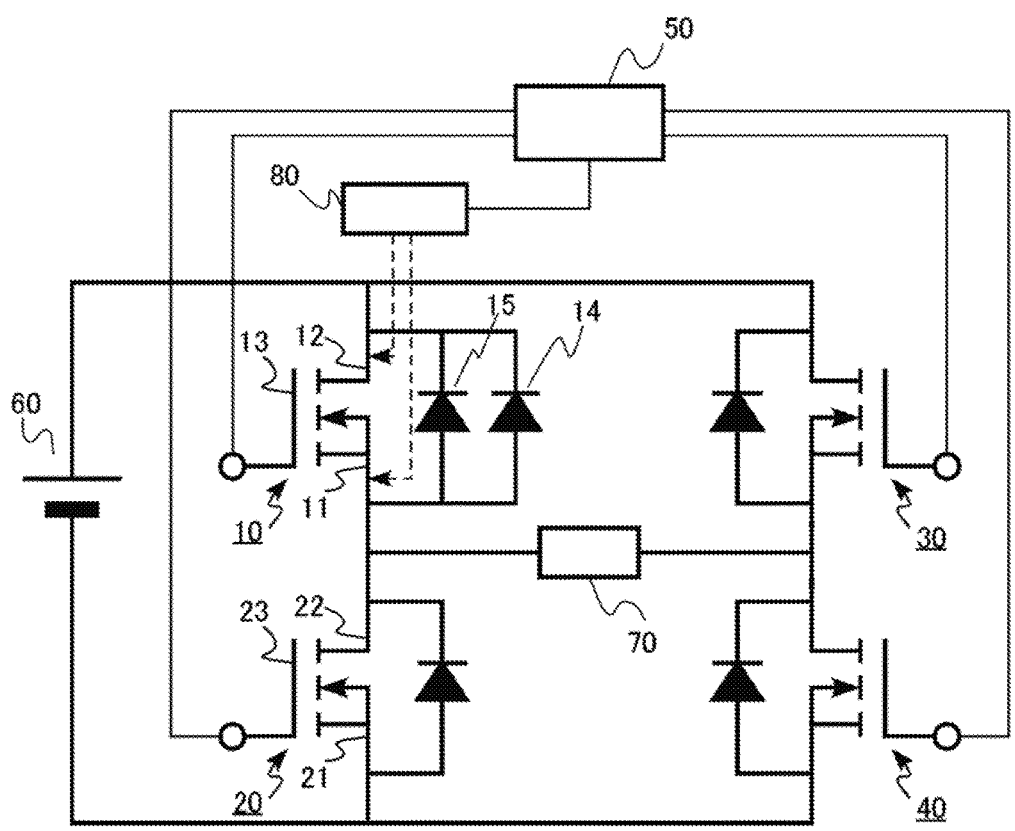
FIG. 11 is a circuit diagram illustrating a semiconductor device according to a second embodiment.

FIG. 11 is a circuit diagram illustrating the semiconductor device according to the second embodiment. The semiconductor device according to the second embodiment is a single-phase inverter circuit.

The single-phase inverter circuit according to the second embodiment includes a first transistor 10, a second transistor 20, a third transistor 30, a fourth transistor 40, a gate control device 50, and a monitor circuit 80. The inverter circuit is connected to a power supply 60 and an inductive load 70. The inverter circuit uses the first transistor 10, the second transistor 20, the third transistor 30, and the fourth transistor 40 as switching elements and controls a direction of a voltage to be applied to the inductive load 70.

The monitor circuit 80 monitors a difference (Vds) between a voltage of the first drain electrode 12 and a voltage of the first source electrode 11. The monitor circuit 80 is, for example, hardware or a combination of hardware and software. The monitor circuit 80 is, for example, an IC or a circuit board. The monitor circuit 80 may be a plurality of ICs or a combination of a plurality of ICs and a circuit board.

A method for controlling the inverter circuit according to the second embodiment is substantially the same as that of the first embodiment excepting that the timing of time t3 in FIGS. 7A and 7B can be decided or set using the monitor circuit 80.

Figure 12:
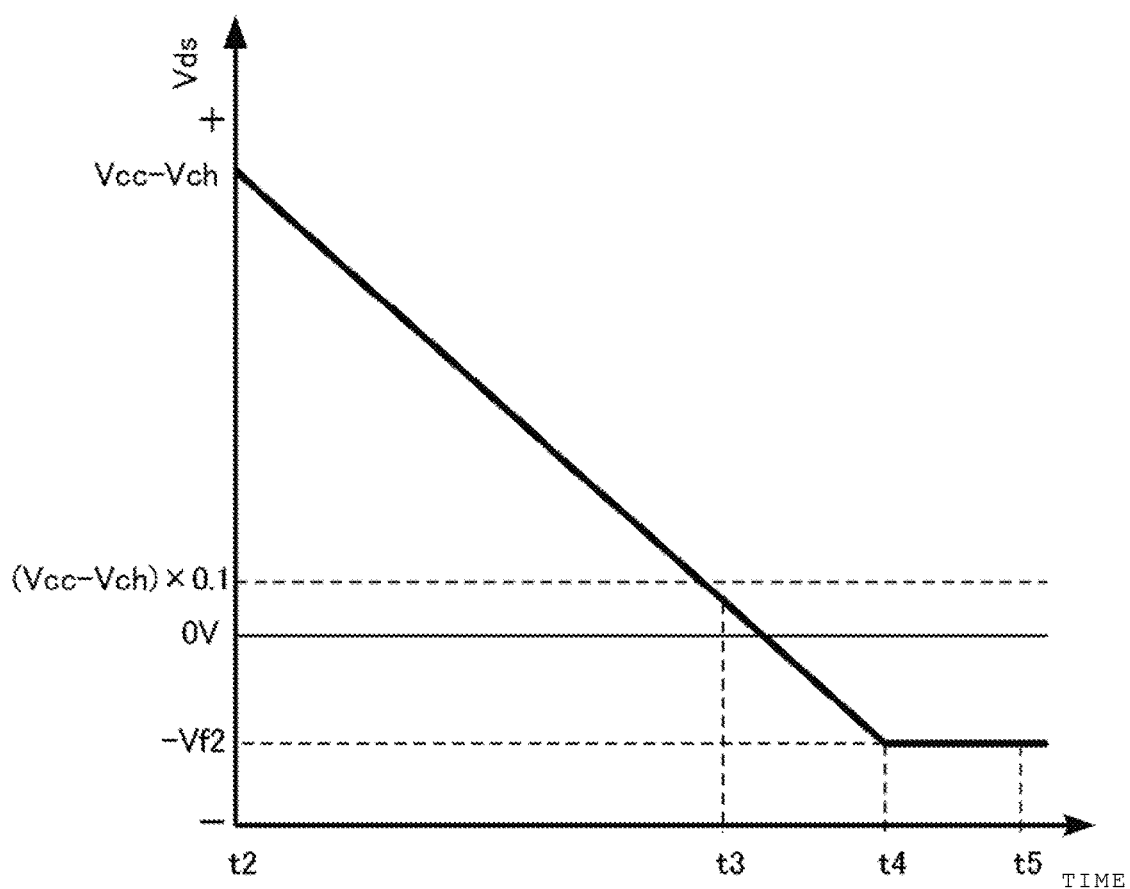
FIG. 12 is a diagram illustrating a method for controlling an inverter circuit according to the second embodiment.

FIG. 12 is a diagram illustrating a method for controlling an inverter circuit according to the second embodiment. The horizontal axis represents time and the vertical axis represents the difference (Vds) between the voltage of the first drain electrode 12 and the voltage of the first source electrode 11. Times t2, t3, t4, and t5 correspond to times t2, t3, t4, and t5 depicted in FIGS. 7A and 7B.

At time t2, the off-state voltage (Voff) is applied to the gate electrode 23 of the second transistor 20. Accordingly, both of the first transistor 10 and the second transistor 20 enter the off-state.

After time t2, a load current generated from the inductive load flows, and thus the potential of the source electrode 11 of the first transistor 10 increases. Accordingly, the difference (Vds) continuously decreases after time t2. An initial value of the difference (Vds) in the voltage is a voltage (Vcc-Vch) obtained by subtracting an on-state voltage (Vch) of the second transistor 20 from a power voltage (Vcc) of the power supply 60.

Here, the difference (Vds) is monitored by the monitor circuit 80. After and the difference (Vds) becomes, for example, 10% of the initial value of the voltage (Vcc-Vch) the voltage applied to the first gate electrode 13 is increased. For example, as illustrated in FIG. 12, the voltage applied to the first gate electrode 13 is increased within a range in which the difference (Vds) is between about 0 V and about 10% of the initial value of the difference (Vds). For example, at a time point at which the difference (Vds) is 10% of the initial value of the difference (Vds), the voltage applied to the first gate electrode 13 is increased.

In the inverter circuit according to the second embodiment, a current does not flow in the second body diode 15 until the absolute value of the difference (Vds) reaches the forward voltage (Vf2) of the second body diode 15. The forward voltage (Vf2) of the second body diode 15 can be changed according the voltage applied to the first gate electrode 13.

Accordingly, from the viewpoint that a free-wheeling current flows to the second body diode 15, it is not necessary to apply the intermediate voltage (Vm) to the first gate electrode 13 until a time (t4 in FIG. 12) at which the absolute value of the difference (Vds) reaches the forward voltage (Vf2) of the second body diode 15.

The forward voltage (Vf2) after the adjustment is at least a positive value. Accordingly, when the difference (Vds) is equal to or greater than 0, a current will not flow in the second body diode 15. Thus, from the viewpoint of permitting a free-wheeling current to flow in to second body diode 15, it is not necessary to apply the intermediate voltage (Vm) to the first gate electrode 13 while the difference (Vds) is equal to or greater than 0.

On the other hand, if the intermediate voltage (Vm) is applied to the first gate electrode 13 when the voltage of the difference (Vds) is high, a leakage current will flow between the first drain electrode 12 and the first source electrode 11, and thus there is a concern of a power loss increasing due to an increased in leakage current. Further, there is a concern about a through-current possibly flowing due to an erroneous operation of the inverter circuit.

According to the second embodiment, a voltage between the first drain electrode 12 and the first source electrode 11 is sufficiently lowered, and only then is the intermediate voltage (Vm) applied to the first gate electrode 13. Accordingly, an increase in leakage current between the first drain electrode 12 and the first source electrode 11 is prevented. Furthermore, it is possible to prevent a through-current from occurring due to an erroneous operation of the inverter circuit. Thus, it is possible to prevent the leakage current and the through-current.

Furthermore, according to the second embodiment, the difference (Vds) is monitored by the monitor circuit 80 the monitoring result is fed back to the gate control device 50. Accordingly, precision of the timing at which the intermediate voltage (Vm) is applied to the gate electrode 13 is improved. Thus, it is possible to realize prevention of a leakage current and prevention of a through-current with high precision.

As described above, according to the second embodiment, as in the first embodiment, the inverter circuit capable of preventing the growth of a stacking fault in the silicon carbide layer and improving reliability is realized. Further, the inverter circuit capable of realizing prevention of a leakage current and prevention of a through-current reliably and with high precision is supplied.

In the first and second embodiments, the case in which the crystal structure of SiC is 4H—SiC was exemplified, but these examples can also be applied to a transistor in which another crystal structure of SiC such as 6H—SiC or 3C—SiC is used. The surface of the silicon carbide layer 1 may have planes other than the (0001) plane.

In the first and second embodiments, an n channel MOSFET was exemplified, but these examples can also be applied to a p channel MOSFET.

In the first and second embodiments, the single-phase inverter circuit was exemplified, but these examples can also be applied to other circuits such as a chopper circuit and a three-phase inverter circuit.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device, comprising:
 a first transistor including:
  a first source electrode,
  a first drain electrode,
  a first gate electrode,
  a silicon carbide layer which is between the first source electrode and the first drain electrode and between the first gate electrode and the first drain electrode, and
  a diode formed in the silicon carbide layer as a pn junction, the first source electrode being an anode of the diode, the first drain electrode being a cathode of the diode, and the diode having a forward voltage that varies in accordance with a voltage applied to the first gate electrode;
 a second transistor that includes a second source electrode, a second drain electrode connected to the first source electrode, and a second gate electrode; and
 a gate controller configured to apply a first gate voltage to the first gate electrode and a second gate voltage to the second gate electrode such that
  the first and second gate voltages are set to a predetermined off-state voltage at a first time,
  the second gate voltage is set to a predetermined on-state voltage at a second time after the first time, while the first gate voltage is kept at the predetermined off-state voltage,
  the second gate voltage is returned to the predetermined off-state voltage at a third time after the second time,
  the first gate voltage is increased from the predetermined off-state voltage to an intermediate voltage that is less than a first threshold voltage of the first transistor while a difference between a voltage of the first drain electrode and a voltage of the first source electrode is decreasing, the intermediate voltage being applied at a fourth time after the third time and sufficient to alter the forward voltage of the diode and permit a forward current to flow in the diode, and the first gate voltage is increased from the intermediate voltage to the predetermined on-state voltage at a fifth time after the fourth time.

2. The semiconductor device according to claim 1, further comprising:
a monitoring circuit configured to compare the voltage of the first drain electrode and the voltage of the first source electrode and output a monitor signal corresponding to the difference between the voltage of the first drain electrode and the voltage of the first source electrode, wherein
the gate controller is configured to increase the first gate electrode voltage from the predetermined off-state voltage to the intermediate voltage according to the monitor signal.

3. The semiconductor device according to claim 2, wherein the monitoring circuit is configured to output the monitor signal at a level to cause the gate controller to increase the first gate electrode voltage from the predetermined off-state voltage to the intermediate voltage when the difference between the voltage of the first drain and the voltage of the source voltage decreases to a level that is 10% of the difference between the voltage of the first drain and the voltage of the first source voltage at the first time.

4. The semiconductor device according to claim 1, wherein the gate controller is configured to increase the first gate electrode voltage from the predetermined off-state voltage to the intermediate voltage when the difference between the voltage of the first drain and the voltage of the source voltage decreases to a level that is 10% of the difference between the voltage of the first drain and the voltage of the first source voltage at the first time.

5. The semiconductor device according to claim 1, further comprising:
a third transistor having a third drain electrode connected to a first power supply terminal;
a fourth transistor having a fourth drain electrode connected to a third source electrode of the third transistor, a fourth source electrode of the fourth transistor connected to a second power supply terminal, wherein
the first drain electrode is connected to the first power supply terminal,
the second source electrode is connected to second power supply terminal, and
the gate controller is further configured to control the first, second, third, and fourth transistors to supply alternating current to a load having one terminal connected to a node between the second drain electrode and the first source electrode and another terminal connected to a node between the fourth drain electrode and the third source electrode.

6. The semiconductor device according to claim 5, wherein the load is an electric motor.

7. The semiconductor device according to claim 1, wherein the first and second transistors are n-channel metal-oxide-semiconductor field effect transistors.

8. The semiconductor device according to claim 1, wherein
the first drain electrode is connected to a first power supply line, and
the second source electrode is connected to a second power supply line.

9. The semiconductor device according to claim 8, further comprising:
a direct-current power supply connected to the first and second power supply lines.

10. The semiconductor device according to claim 9, wherein the direct-current power supply is a battery.

11. A method for controlling a semiconductor device including a first transistor and a second transistor, the first transistor having a first source electrode, a first drain electrode, a first gate electrode, a silicon carbide layer which is between the first source electrode and the first drain electrode and between the first gate electrode and the first drain electrode, and a diode formed in the silicon carbide layer as a pn junction, the first source electrode being an anode of the diode, the first drain electrode being a cathode of the diode, and the diode having a forward voltage that varies in accordance with a voltage applied to the first gate electrode; and the second transistor having a second source electrode, a second drain electrode connected to the first source electrode, and a second gate electrode, the method comprising:
applying a predetermined off-state voltage to the first and second gate electrodes at a first time;
applying a predetermined on-state voltage to the second gate electrode at a second time after the first time, while the first gate electrode is kept at the predetermined off-state voltage,
returning the second gate electrode to the predetermined off-state voltage at a third time after the second time,
increasing the first gate voltage from the predetermined off-state voltage to an intermediate voltage that is less than a first threshold voltage of the first transistor at a fourth time after the third time while a difference between a voltage of the first drain electrode and a voltage of the first source electrode is decreasing, the intermediate voltage being sufficient to alter the forward voltage of the diode and permit a forward current to flow in the diode; and
increasing the first gate voltage from the intermediate voltage to the predetermined on-state voltage at a fifth time after the fourth time.

12. The method of claim 11, further comprising:
comparing the voltage of the first drain electrode and the voltage of first source electrode; and
outputting a control signal corresponding to the difference between the voltage of the first drain electrode and the voltage of the first source electrode, wherein
the first gate voltage is increased from the intermediate voltage to the predetermined on-state voltage at the third time in accordance with the control signal.

13. The method of claim 11, further comprising:
increasing the first gate electrode voltage from the predetermined off-state voltage to the intermediate voltage when the difference between the voltage of the first drain and the voltage of the source voltage decreases to a level that is 10% of the difference between the voltage of the first drain and the voltage of the first source voltage at the first time.

14. A semiconductor device, comprising:
a first transistor formed on a silicon carbide layer;
a second transistor connected in series with the first transistor between a first power supply node and a second power supply node;
a first node between first and second transistors being connectable to a first load terminal; and
a gate controller connected to a first gate electrode of the first transistor and a second gate electrode of the second transistor, wherein
the first transistor comprises:
a first silicon carbide region of a first conductivity type in the silicon carbide layer, the first silicon carbide region being between a central portion of the first gate electrode and a first drain electrode along a first direction and having a portion directly adjacent to the central portion of the first gate electrode via a gate insulating film; and a second silicon carbide region of a second conductivity type in the silicon carbide layer, the second conductivity type being opposite the first conductivity type, the second silicon carbide region having a first portion directly adjacent to the first silicon carbide region in the first direction and a second portion between the first portion and the first gate electrode in the first direction and adjacent to the first gate electrode via the gate insulation film in the first direction and directly adjacent to the portion of the first silicon carbide region in a second direction crossing the first direction; and the gate controller is configured to apply a first gate voltage to the first gate electrode and a second gate voltage to the second gate electrode such that the first and second gate voltages are set to a predetermined off-state voltage at a first time, the second gate voltage is set to a predetermined on-state voltage at a second time after the first time, while the first gate voltage is kept at the predetermined off-state voltage, the second gate voltage is returned to the predetermined off-state voltage at a third time after the second time, the first gate voltage is increased from the predetermined off-state voltage to an intermediate voltage that at a fourth time after the third time while the second gate voltage is at the predetermined off-state voltage, the intermediate voltage level being less than a threshold voltage of the first transistor but sufficient to permit a load current supplied at the first node to flow through a junction between the second silicon carbide region and the first silicon carbide region, and the first gate voltage is increased from the intermediate voltage to the predetermined on-state voltage at a fifth time after the fourth time.

15. The semiconductor device according to claim 14, wherein the first conductivity type is n-type conductivity.

16. The semiconductor device according to claim 14, wherein the first transistor is a vertical-type MOSFET.

17. The semiconductor device according to claim 14, wherein the first node is connected to a motor.

18. The semiconductor device according to claim 14, wherein the first power supply node and the second power supply node are connected to a battery.

19. The semiconductor device according to claim 14, further comprising:

a monitoring circuit connected to the first source electrode and the first drain electrode and configured to output a signal to the gate controller corresponding to a voltage difference between the first drain electrode and the first source electrode.

20. The semiconductor device according to claim 19, wherein timing of the fourth time is set according to the control signal from the monitoring circuit.

* * * * *